(12) United States Patent
Oh et al.

(10) Patent No.: US 9,276,376 B2
(45) Date of Patent: Mar. 1, 2016

(54) LASER MODULE

(71) Applicant: Electronics and Telecommunications Research Institute, Daejeon (KR)

(72) Inventors: Su Hwan Oh, Daejeon (KR); Oh Kee Kwon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/336,504

(22) Filed: Jul. 21, 2014

(65) Prior Publication Data

US 2015/0131687 A1    May 14, 2015

(30) Foreign Application Priority Data

Nov. 8, 2013    (KR) .................... 10-2013-0135634

(51) Int. Cl.
*H01S 5/024* (2006.01)
*H01S 5/022* (2006.01)
*H01S 5/40* (2006.01)

(52) U.S. Cl.
CPC ......... *H01S 5/02469* (2013.01); *H01S 5/02212* (2013.01); *H01S 5/02284* (2013.01); *H01S 5/4012* (2013.01)

(58) Field of Classification Search
CPC . H01S 5/022; H01S 5/02212; H01S 5/02208; H01S 5/02244; H01S 5/0228; H01S 5/02284; H01S 5/024; H01S 5/02415; H01S 5/0245; H01S 5/02469; H01S 5/02476; H01S 5/042; H01S 5/0425; H01S 5/40; H01S 5/4025
See application file for complete search history.

(56) References Cited

U.S. PATENT DOCUMENTS

| | | | |
|---|---|---|---|
| 7,298,937 B2 | 11/2007 | Keh et al. | |
| 8,699,533 B1* | 4/2014 | Wach | 372/34 |
| 2002/0057718 A1 | 5/2002 | Ahn et al. | |
| 2007/0091952 A1* | 4/2007 | Mukoyama et al. | 372/43.01 |
| 2007/0155197 A1* | 7/2007 | Miao et al. | 439/67 |
| 2010/0074282 A1 | 3/2010 | Oh et al. | |
| 2010/0208756 A1 | 8/2010 | Noh | |
| 2011/0085767 A1* | 4/2011 | Miao | 385/93 |

FOREIGN PATENT DOCUMENTS

| | | |
|---|---|---|
| KR | 10-0396360 B1 | 9/2003 |
| KR | 2009-0011837 A | 2/2009 |
| KR | 2010-0034232 A | 4/2010 |
| KR | 2012-0056480 A | 6/2012 |

OTHER PUBLICATIONS

Yanxin Zhang et al., "A New Package Structure for High Power Single Emitter Semiconductor Lasers", 2010 11th International Conference on Electronic Packaging Technology & High Density Packaging, 2010 IEEE, pp. 1346-1349, Aug. 2010.

* cited by examiner

*Primary Examiner* — Armando Rodriguez
(74) *Attorney, Agent, or Firm* — Rabin & Berdo, P.C.

(57) ABSTRACT

A laser module includes a Transmitter Optical Sub-Assembly (TOSA) and a heat radiating means. The TOSA generates light by an electrical signal and transmits the generated light through an optical fiber. The heat radiating means is in contact with the TOSA to discharge heat generated by the TOSA.

20 Claims, 7 Drawing Sheets

LASER MODULE

CROSS-REFERENCE TO RELATED APPLICATION

This application is based on and claims priority from Korean Patent Application No. 10-2013-0135634, filed on Nov. 8, 2013, with the Korean Intellectual Property Office, the disclosure of which is incorporated herein in its entirety by reference.

BACKGROUND

1. Field

The present invention relates to a laser module, and more particularly, to a laser module in which a heat radiating means is attached to a high-power transmitter optical sub-assembly.

2. Discussion of Related Art

A laser diode is a device having high usability in various fields due to an inherent characteristic of laser, such as polarization, coherence, and a straight property. The laser diode is a light source usable in a laser LCD backlight unit (BLU), a 3D projector, a 3D imaging device, a large screen 2D/3D home theater, and a holography image. The laser diode has a ripple effect in a medical industry, a semiconductor/electronic industry, an automobile/shipbuilding industry, and a national defense industry, as well as a display field. To this end, research on a high-power laser diode having high power among the laser diodes has been actively conducted. In the high-power laser diode field, optimization of a characteristic of a single optical source chip is considerably implemented, but it is not easy to design a heat radiating structure for minimizing a change in a characteristic by electrical/optical mutual interference according to integration and deterioration of performance by heat storage. Particularly, it is necessary to design an optical structure for improving efficiency of a combination between an array optical source chip and optical fibers and minimizing a reflection problem, and the like. Particularly, research on a thermal package using a semiconductor laser capable of outputting power of 1 W or more is still in a beginning stage.

SUMMARY

The present invention has been made in an effort to provide a laser module operated with an output of 1 W or more.

An embodiment of the present invention provides a laser module including a Transmitter Optical Sub-assembly (TOSA) and a heat radiating means. The TOSA emits the beam by an electrical signal and transmits the lasing beam through an optical fiber. The heat radiating means is consist of releasing the generated heat from the TOSA in contact with the TOSA.

According to the exemplary embodiment, the TOSA may include a Transistor Outline can (TO-CAN) optical module, an optical fiber, and an external housing. The TO-CAN optical module may generate light by the electrical signal. The optical fiber may transmit light generated by the TO-CAN optical module. The external housing may accommodate the TO-CAN optical module and one end of the optical fiber.

According to the exemplary embodiment, the TO-CAN optical module may include: an electrode configured to receive the electrical signal; a laser diode configured to generate light based on the electrical signal input from the electrode; a sub mount configured to fix the laser diode; a fixing block configured to fix the sub mount; a platform configured to accommodate the fixing block and the electrode; a TO-CAN cylindrical block configured to cover the laser diode, the sub mount, and the fixing block on one surface of the platform; and an integrated lens positioned on an upper surface of the TO-CAN cylindrical block to allow light generated by the laser diode to pass through.

According to the exemplary embodiment, the heat radiating means may include a heat sink formed to surround at least a part of the TOSA.

According to the exemplary embodiment, the heat sink may include a first heat sink block, a second heat sink block, and at least one fixing screw. The first heat sink block may cover one surface of the TOSA. The second heat sink block may cover the other surface of the TOSA. At least one fixing screw may closely contact between the first heat sink block and the second heat sink block.

According to the exemplary embodiment, the heat radiating means may further include at least one of a Thermal Electric Cooler (TEC), a chiller, and a heat radiating plate, which are attached to the heat sink to reduce heat generated by the TOSA.

According to the exemplary embodiment, the laser diode may be a blue Laser Diode (Blue LD).

Another embodiment of the present invention provides a laser module including a plurality of TOSAs and a heat radiating means. Each of the plurality of TOSAs generates light by an electrical signal and transmits the generated light through an optical fiber. The heat radiating means is in contact with the plurality of TOSAs to discharge heat generated by the plurality of TOSAs.

According to the exemplary embodiment, each of the plurality of TOSAs may include a TO-CAN optical module, an optical fiber, and an external housing. The TO-CAN optical module may generate light by the electrical signal. The optical fiber may transmit light generated by the TO-CAN optical module. The external housing may accommodate the TO-CAN optical module and one end of the optical fiber. The laser module may further include a combined optical fiber in which the optical fibers included in the plurality of TOSAs are connected and combined into one optical fiber.

According to the exemplary embodiment, the heat radiating means may include a plurality of heat sinks formed to accommodate at least a part of the plurality of TOSAs.

According to the exemplary embodiment, each of the heat sinks may include a first heat sink block, a second heat sink block, and at least one fixing screw. The first heat sink block may cover one surface of the corresponding TOSA. The second heat sink block may cover the other surface of the corresponding TOSA. At least one fixing screw may be engaged with the first heat sink block and the second heat sink block to make the first heat sink block and the second heat sink block be in close contact with each other.

According to the exemplary embodiment, the plurality of TOSAs may be disposed in an array type. The heat radiating means may include a heat sink formed to accommodate at least a part of the plurality of TOSAs disposed in the array type.

According to the exemplary embodiment, the heat sink may include a first heat sink block, a second heat sink block, and at least one fixing screw. The first heat sink block may cover one surface of each of the plurality of TOSAs disposed in the array type. The second heat sink block may cover the other surface of each of the plurality of TOSAs disposed in the array type. At least one fixing screw may make the first heat sink block and the second heat sink block be in close contact with each other.

Yet another embodiment of the present invention provides a laser module including an optical output control circuit, a current and voltage control circuit, a plurality of TOSAs, a temperature control circuit, and a heat radiating means. The optical output control circuit outputs an optical output control signal. The current and voltage control circuit outputs a current and a voltage based on an optical output control signal output from the optical output control circuit. The plurality of TOSAs generates light based on the current and the voltage output from the current and voltage control circuit, and transmits the generated light through the optical fiber. The temperature control circuit detects temperatures of the plurality of TOSAs and output a temperature control signal. The heat radiating means is in contact with the plurality of TOSAs and discharges heat generated by the plurality of TOSAs based on the temperature control signal.

According to the exemplary embodiment, the plurality of TOSAs may be disposed in an array type. The heat radiating means may include a heat sink formed to accommodate at least a part of the plurality of TOSAs disposed in the array type. The heat radiating means may further include at least one of a TEC, a chiller, and a heat radiating plate, which are attached to the heat sink to discharge heat generated by the TOSA based on the temperature control signal.

According to the embodiment of the present invention, the TOSA of the laser module is manufactured by using the TO-CAN optical module without a complicated package process, thereby improving mass production ability. Further, heat of the laser diode is smoothly discharged by the heat radiating means, so that it is possible to manufacture a light source operable even with high power of 1 W or more and capable of improving reliability.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

Figure 1:
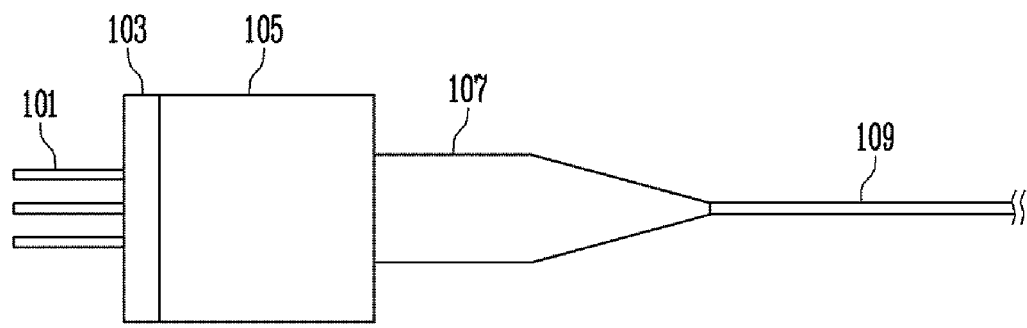
FIG. 1 is a diagram illustrating an appearance of a high-power Transmitter Optical Sub-Assembly (TOSA) according to an exemplary embodiment of the present invention.

FIG. 1 is a diagram illustrating an appearance of a high-power Transmitter Optical Sub-Assembly (TOSA) according to an exemplary embodiment of the present invention.

Referring to FIG. 1, a high-power TOSA 100 includes lead lines 101, a platform 103, an external housing 105, a fixed cover 107, and an optical fiber 109. The high-power TOSA 100 of FIG. 1 includes a Transistor Outline CAN (TO-CAN) optical module, and is configured to generate light by an electrical signal and transmit the generated light through the optical fiber 109. Further, the lead lines 101 and the platform 103, which are parts of the TO-CAN optical module are illustrated due to the external housing 105.

The lead line 101 is an electrode of the high-power TOSA and receives an input of a current and a voltage input from the outside. Polarities of the illustrated three lead lines 101 may be positive (+), negative (−), and ground, respectively. The lead lines 101 serving as the electrodes of the high-power TOSA may adopt a read pin structure according to an exemplary embodiment. The platform 103 may accommodate each constituent element of the TO-CAN optical module. Further, the platform 103 may be coupled with the cylinder-shaped external housing 105 to protect internal constituent components of the TO-CAN optical module. The platform 103 may have a disc shape. The external housing 105 may be coupled with the platform 103, and may be coupled with the fixed cover 107 to accommodate one end of the optical fiber 109. The fixed cover 107 may be coupled with the external housing 105 while surrounding at least a part of the optical fiber 109. Although it is not illustrated in FIG. 1, a ferrule is present inside the fixed cover 107, so that the optical fibers 109 may be inserted into and fixed to the ferrule, and may accommodate light emitted by the TO-CAN module.

Figure 2:
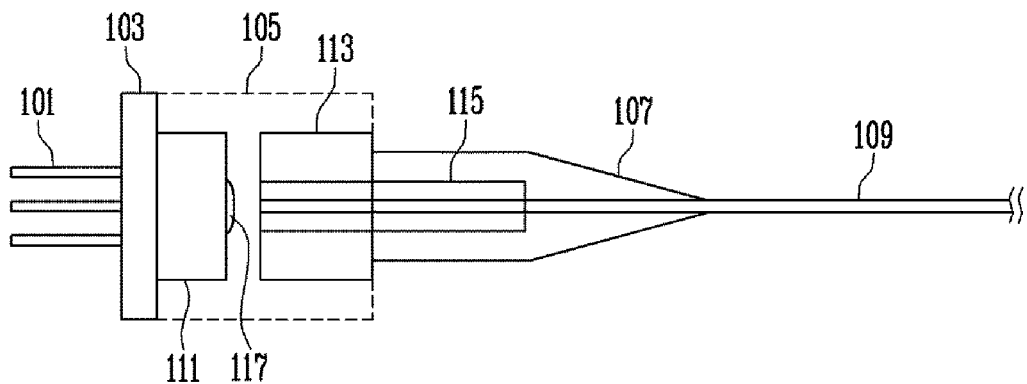
FIG. 2 is a diagram illustrating an internal structure of the high-power TOSA of FIG. 1.

FIG. 2 is a diagram illustrating an internal structure of the high-power TOSA of FIG. 1. In FIG. 2, the external housing 105 is illustrated with a dotted line for convenience of the illustration. The high-power TOSA 100 includes a TO-CAN optical module, and the TO-CAN optical module includes the lead lines 101, the platform 103, a cylindrical block 111, and an integrated lens 117. Only a part of the integrated lens 117 is illustrated in FIG. 2 by the cylindrical block 111. Further, although it is not illustrated, the TO-CAN optical module may include a laser diode, a sub mount, and a fixing block. A particular configuration of the TO-CAN optical module will be described later with reference to FIGS. 3 and 4.

Referring to FIG. 2, the high-power TOSA 100 includes the TO-CAN optical module, the external housing 105, the fixe cover 107, the optical fibers 109, an internal housing 113, and a ferrule 115. The external housing 105 may be coupled with the platform 103, and may be coupled with the fixed cover 107 to accommodate one end of the optical fiber 109, as described above.

The ferrule 115, which is a component used for alignment of the optical fibers transmitting light, may be included through an internal side and an external side of the external housing 105. The TO-CAN optical module includes the high-power TOSA 100, so that it is possible to easily actively align the optical fibers through the ferrule 115. Further, in a case where the laser module is manufactured by using the high-power TOSA 100 including the TO-CAN optical module, a manufacturing process thereof is simple and convenient, and mass production ability and reliability are excellent compared to manufacturing of a buffer fly module using a single chip.

As illustrated in FIG. 2, the ferrule 115 may be positioned inside the internal housing 113 and the fixed cover 107 to accommodate the one ends of the optical fibers 109. The arranged positions of the optical fibers 109 are fixed by the external housing 105, the internal housing 113, and the ferrule 115, so that the optical fiber 109 may stably transmit light emitted from the integrated lens 117 of the TO-CAN optical module.

Figure 3:
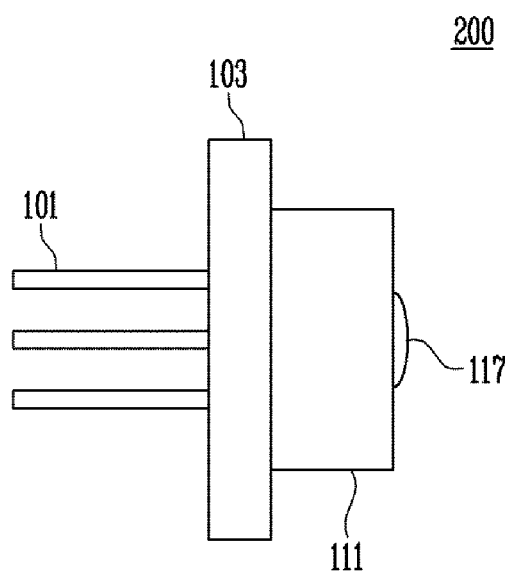
FIG. 3 is a diagram illustrating an appearance of a Transistor Outline CAN (TO-CAN) optical module included in the high-power TOSA of FIG. 1.

FIG. 3 is a diagram illustrating an appearance of the TO-CAN optical module included in the high-power TOSA of FIG. 1.

Referring to FIG. 3, the TO-CAN optical module 200 includes the lead lines 101, the platform 103, the cylindrical block 111, and the integrated lens 117, and although it is not illustrated, the TO-CAN optical module 200 may further include the fixing block, the sub mount, and the laser diode. In FIG. 3, the fixing block, the sub mount, and the laser diode are accommodate inside the cylindrical block 111, so that the illustration thereof is omitted, and particular configurations thereof will be described below with reference to FIG. 4.

Figure 4:
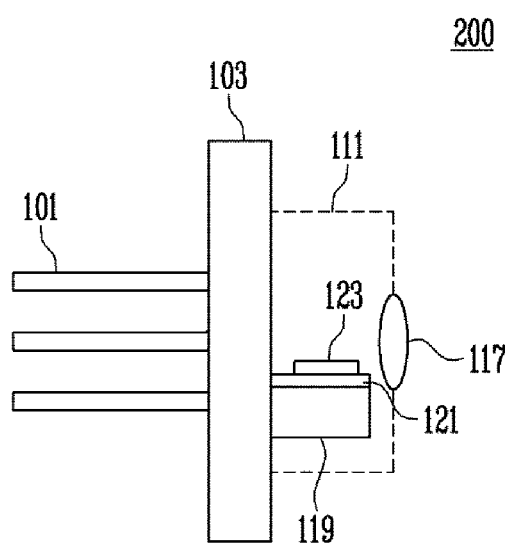
FIG. 4 is a diagram illustrating an internal structure of a TO-CAN optical module of FIG. 3.

FIG. 4 is a diagram illustrating an internal structure of the TO-CAN optical module of FIG. 3.

Referring to FIG. 4, the TO-CAN optical module 200 includes the lead lines 101, the platform 103, the cylindrical block 111, and the fixing block 119, the sub mount 121, the laser diode 123, and the integrated lens 117. In FIG. 4, the cylindrical block 111 is illustrated with a dotted line. Although it is not illustrated in FIG. 4, wires from the lead lines 101 may be connected to the laser diode 123, the sub mount 121, and the fixing block 119 within the cylindrical block 111. The fixing block 119 is fixed to the platform 103 and fixes the sub mount 121. The laser diode 123 is fixed onto the sub mount 121 and fixed to the fixing block 121. The light emitted by the laser diode 123 is collected through the integrated lens 117, and which is transmitted into the optical fibers integrated with the TO-CAN optical module 200. A manufacturing cost of the TO-CAN optical module is low, so that the TO-CAN optical module is used as an optical source module in various fields. In the present invention, the high-power TOSA 100 is manufactured by using the TO-CAN optical module 200, thereby achieving mass production ability and reliability of the laser module.

Figure 5:
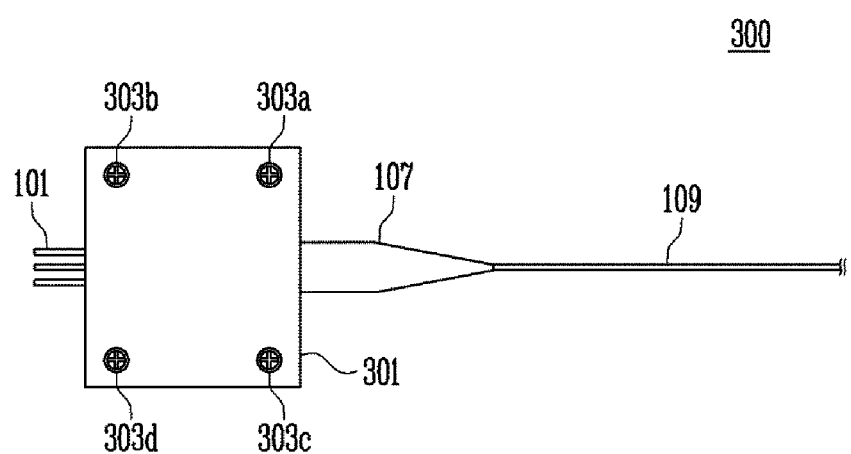
FIG. 5 is a diagram illustrating an appearance of a high-power TOSA to which a heat sink is attached.

FIG. 5 is a diagram illustrating an appearance of a laser module in which a heat sink is attached to a high-power TOSA.

Referring to FIG. 5, a laser module 300 according to an exemplary embodiment of the present invention is configured so that a heat sink 301 is attached to the high-power TOSA 300, and first to fourth fixing screws 303a, 303b, 303c, and 303d are engaged with the heat sink 301. The heat sink 301 is formed the outside of the external housing in a block type, and serves a heat radiation action so as to reduce heat generated by the laser diode to the outside of the module. The heat sink 301 is illustrated in FIG. 5 as an example of a heat radiating means, and the external housing is present inside the heat sink 301, so that the external housing is not illustrated in FIG. 5. A material having excellent thermal conductivity is used for the heat sink 201, and for example, cooper may be used.

The heat sink 301 formed the outside of the external housing of the high-power TOSA may be installed in a form in which two heat sink blocks are coupled with each other. For example, the heat sink 301 may be installed so that the two heat sink blocks having a form of a vacant box are coupled with each other and surround the external housing. In this case, for the coupling of the two heat sink blocks, the first to fourth fixing screws 303a, 303b, 303c, and 303d may be used. In the exemplary embodiment of FIG. 5, the four fixed screws are used for the coupling of the two heat sink blocks, but those skilled in the art will be understood that the number of fixed screws may be adjusted depending on an exemplary embodiment. The action of the fixing screws coupling the heat sink blocks will be described with reference to FIG. 6.

Figure 6:
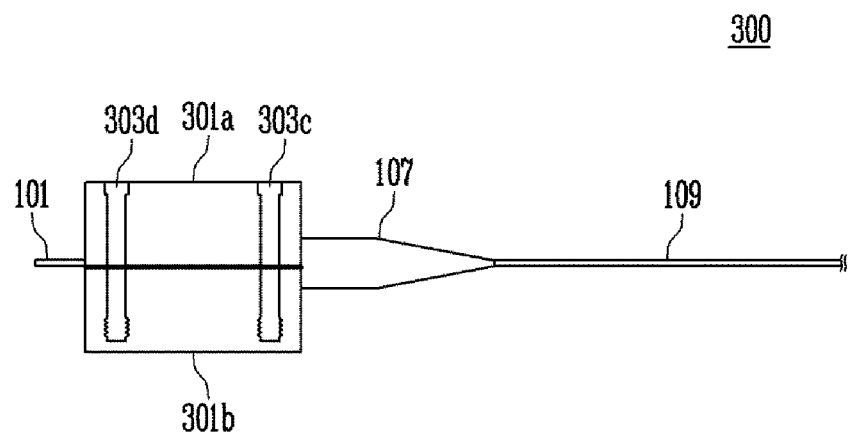
FIG. 6 is a diagram illustrating an appearance of the high-power TOSA of FIG. 5 viewed from a side.

FIG. 6 is a diagram illustrating an appearance of the laser module of FIG. 5 viewed from a side.

Referring to FIG. 6, the heat sink of the laser module 300 includes a first heat sink block 301a and a second heat sink block 301b. For convenience of the illustration, only the first and fourth fixing screws 303c and 303d are illustrated among the first to fourth fixing screws 303a, 303b, 303c, and 303d. As illustrated in FIG. 6, the first heat sink block 301a and the second heat sink block 301b may be coupled by the fixing screws, and may be in close contact with each other by the fixing screws. For the engagement with the fixing screws, the first heat sink block 301a and the second heat sink block 301b may be provided with holes, recesses, and the like through which the fixing screws pass. Through the aforementioned method, the first and second heat sink blocks 301a 303b form one heat sink 301, and are in contact with the external housing 105 of the high-power TOSA to induce the heat emitted by the laser diode to be radiated to the outside.

In order to achieve more smooth heat radiation from the external housing 105 of the high-power TOSA, the first and second heat sink blocks 301a and 303b may be in contact with the external housing 105 through a bonding material. For example, the external housing 105 may be bonded to the first and second heat sink blocks 301a and 303b through Au/Sn solder or silver epoxy having excellent thermal conductivity. In this case, the fixing screws 303a, 303b, 303c, and 303d are engaged, so that a gap generated during the bonding may be reduced. The laser module 300 according to the present invention includes the heat radiating means, such as the heat sink 301, so that the heat radiation action is smoothly performed, thereby achieving a higher output operation. Accordingly, it is possible to improve efficiency and reliability of the laser module.

Figure 7:
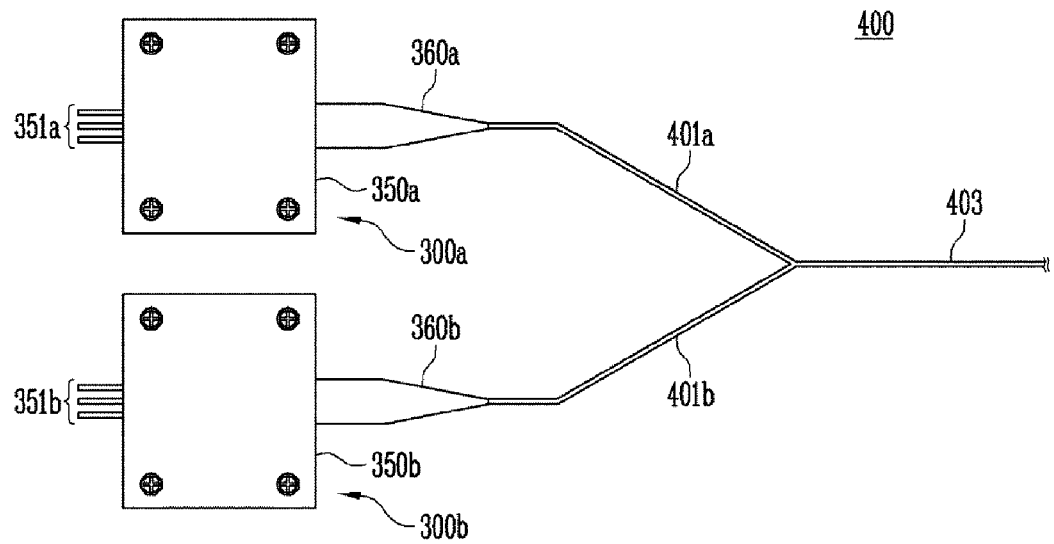
FIG. 7 is a diagram illustrating a first exemplary embodiment of a laser module in which a plurality of high-power TOSAs is disposed in an array structure.

FIG. 7 is a diagram illustrating a first exemplary embodiment of a laser module in which a plurality of high-power TOSAs is disposed in an array structure.

Referring to FIG. 7, a laser module 400 according to an exemplary embodiment of the present invention includes a first high-power TOSA 300a, a first heat sink 350a, a second high-power TOSA 300b, a second heat sink 350b, and a combined optical fiber 403.

The first high-power TOSA 300a may include a TO-CAN optical module inside therein, an external housing, a fixed cover 360a, a first optical fiber 401a, an internal housing, and a ferrule. The TO-CAN optical module includes first lad lines 351a, a platform, a cylindrical block, an integrated lens, and the like. Parts of the TO-CAN optical module, the external housing, and the like are included inside the first heat sink 350a, so that illustration thereof is omitted. Further, the structures of the first high-power TOSA 300a and the TO-CAN optical module inside the first high-power TOSA 300a are the same as those described with reference to FIGS. 1 to 4, so repeated descriptions will be omitted.

Similarly, the second high-power TOSA 300b may include a TO-CAN optical module inside therein, an external housing, a fixed cover 360b, a second optical fiber 401b, an internal housing, and a ferrule. The TO-CAN optical module includes second lad lines 351b, a platform, a cylindrical block, an integrated lens, and the like. Parts of the TO-CAN optical module, the external housing, and the like are included inside the second heat sink 350b, so that illustration thereof is omitted. Further, the structures of the second high-power TOSA 300b and the TO-CAN optical module inside the second high-power TOSA 300b are the same as those described with reference to FIGS. 2 to 4, so repeated descriptions will be omitted.

The combined optical fiber 403 is a combination of the first optical fibers 401 and the second optical fibers 401b and serves to combine the emitted light from the first optical fibers 401a and the second optical fibers 401b. Accordingly, the emitted light from the two high-power TOSAs 300a and 300b, of which output is restricted, is added, so that it is possible to deliver the light of a higher output. Further, in the laser module 400 according to the present invention, the separate heat sinks 350a and 350b are attached to the high-power TOSAs 300a and 300b, respectively, so that the laser diode with a high power can uses by something of the heat radiation. As described above, the laser module 400 according to the exemplary embodiment of the present invention adopts the separate high-power TOSAs 300a and 300b by the heat radiating means, and combines light from the separate high-power TOSAs 300a and 300b through the combined optical fiber 403 and transmits the combined light, thereby achieving high-power optical transmission. For example, when each of the high-power TOSAs performs high output having power of 1 W or more and optical transmission, the laser module of FIG. 7 may perform high output having power of 2 W or more and optical transmission through the combined optical fiber 403. Further, it is possible to manufacture a high-power optical transmitter module having an output of several tens of W or more by combining the plurality of high-power optical transmitter modules.

Figure 8:
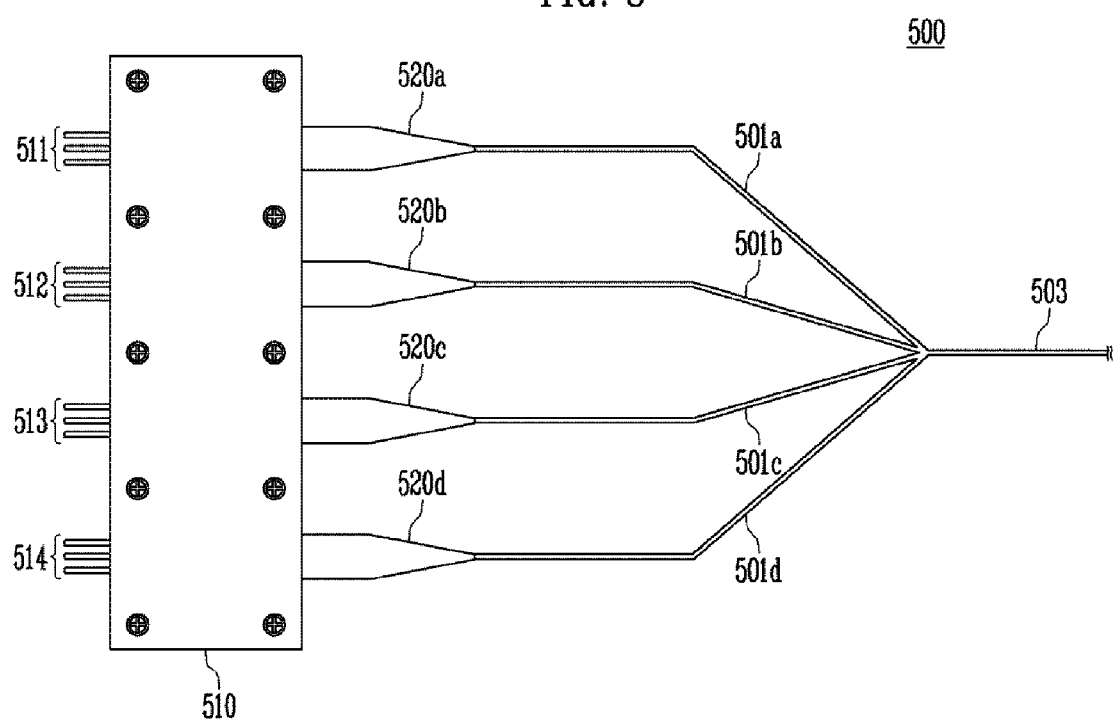
FIG. 8 is a diagram illustrating a second exemplary embodiment of a laser module in which a plurality of high-power TOSAs is disposed in an array structure.

FIG. 8 is a diagram illustrating a second exemplary embodiment of a laser module in which a plurality of high-power TOSAs is disposed in an array structure.

Referring to FIG. 8, the laser module 500 includes first to fourth high-power TOSAs, an array type heat sink 510, and a combined optical fiber 503. First to fourth lead lines 511, 512, 513, and 514, first to fourth fixed covers 520a, 520b, 520c, and 520d, and first to fourth optical fibers 501a, 501b, 501c, and 501d among respective constituent elements of the first to fourth high-power TOSAs are illustrated in FIG. 8. According to the aforementioned structure, it is possible to manufacture a high-power optical transmitter module having several tens of W or more by increasing the number of arrays.

Two or more of each of the high-power TOSAs may be included in the laser module 400 of FIG. 7, and two or more high-power TOSAs is included in the laser module 500 of FIG. 8. Further, the high-power TOSAs are individually attached to the heat sinks in the laser module 400 of FIG. 7, but in the laser module 500 of FIG. 8, the four high-power TOSAs are disposed in the array type, and one array type heat sink 510 is attached to the high-power TOSAs. Similarly to the laser module 400 of FIG. 7, the combined optical fiber 503 is formed by combining the first to fourth optical fibers 501a, 501b, 501c, and 501d to emit light transmitted from each of the high-power TOSAs. As described above, the laser module 500 according to the exemplary embodiment of the present invention adopts the high-power TOSAs having a high-power disposed in the array type by the heat radiating means, and combines light from each of the high-power TOSAs through the combined optical fiber 503 and transmit the combined light, thereby achieving high-power optical transmission with high power.

Figure 9:
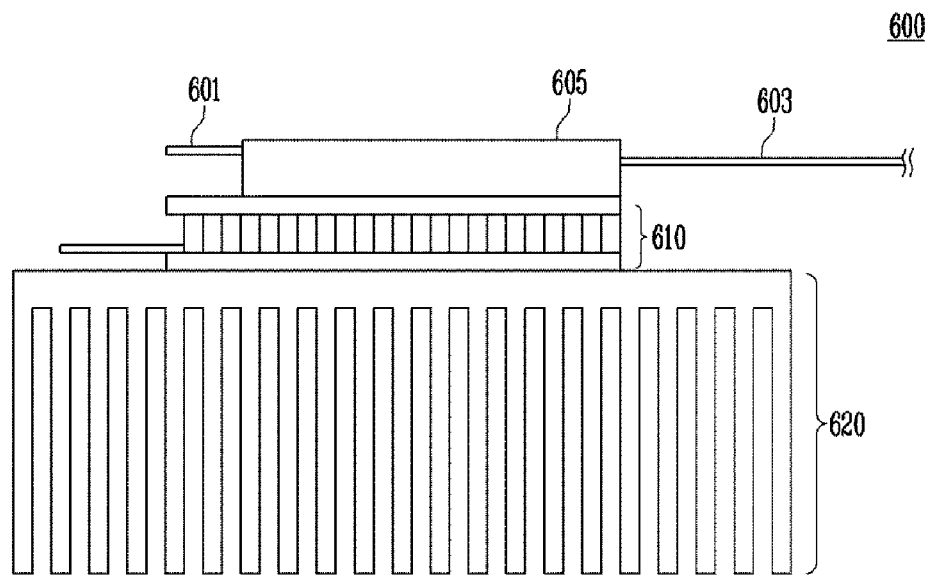
FIG. 9 is a diagram illustrating the laser module including a thermal electric cooler and a heat radiating plate.

FIG. 9 is a diagram illustrating a laser module including a Thermal Electric Cooler (TEC) and a heat radiating plate. A lateral side of the laser module is illustrated in FIG. 9.

Referring to FIG. 9, the laser module 600 according to an exemplary embodiment of the present invention includes a high-power TOSA, a heat sink 605, a TEC 610, and a heat radiating plate 620. Most of the high-power TOSA is accommodated inside the heat sink 605, so that FIG. 9 illustrates only a part of a lead line 601 and an optical fiber 603.

The TEC 610 absorbs cools the emitted light from the heat sink 605, so that it is possible to more smoothly radiate heat of the high-power TOSA. Further, the heat radiating plate 620 decreases the generated light by the TEC 610, so that heat radiation of the high-power TOSA is generally facilitated, thereby achieving a high-power laser diode operation.

Figure 10:
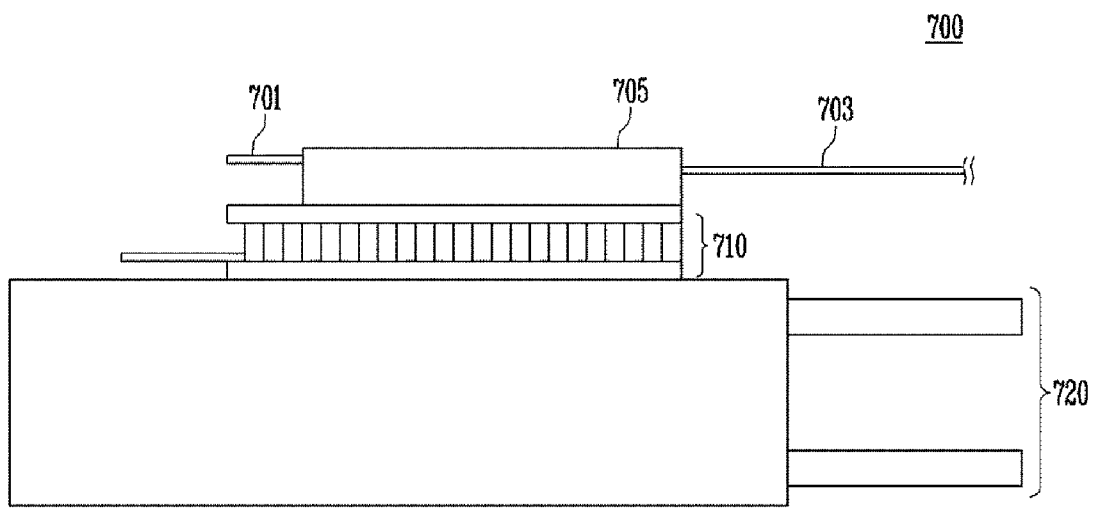
FIG. 10 is a diagram illustrating a laser module including a thermal electric cooler and a chiller.

FIG. 10 is a diagram illustrating a laser module including a TEC and a chiller. A lateral side of the laser module is illustrated in FIG. 10.

Referring to FIG. 10, the laser module 700 according to an exemplary embodiment of the present invention includes a high-power TOSA, a heat sink 705, a TEC 710, and a chiller 720. Most of the high-power TOSA is accommodated inside the heat sink 705, so that FIG. 10 illustrates only a part of a lead line 701 and an optical fiber 703.

The TEC 710 absorbs and cools light discharged from the heat sink 705, so that it is possible to more smoothly radiate the heat of the high-power TOSA. Further, the chiller 720, which performs a cooling function through cooling water, decreases light generated by the TEC 710, so that heat radiation of the high-power TOSA is generally facilitated, thereby achieving a high-power laser diode operation.

Figure 11:
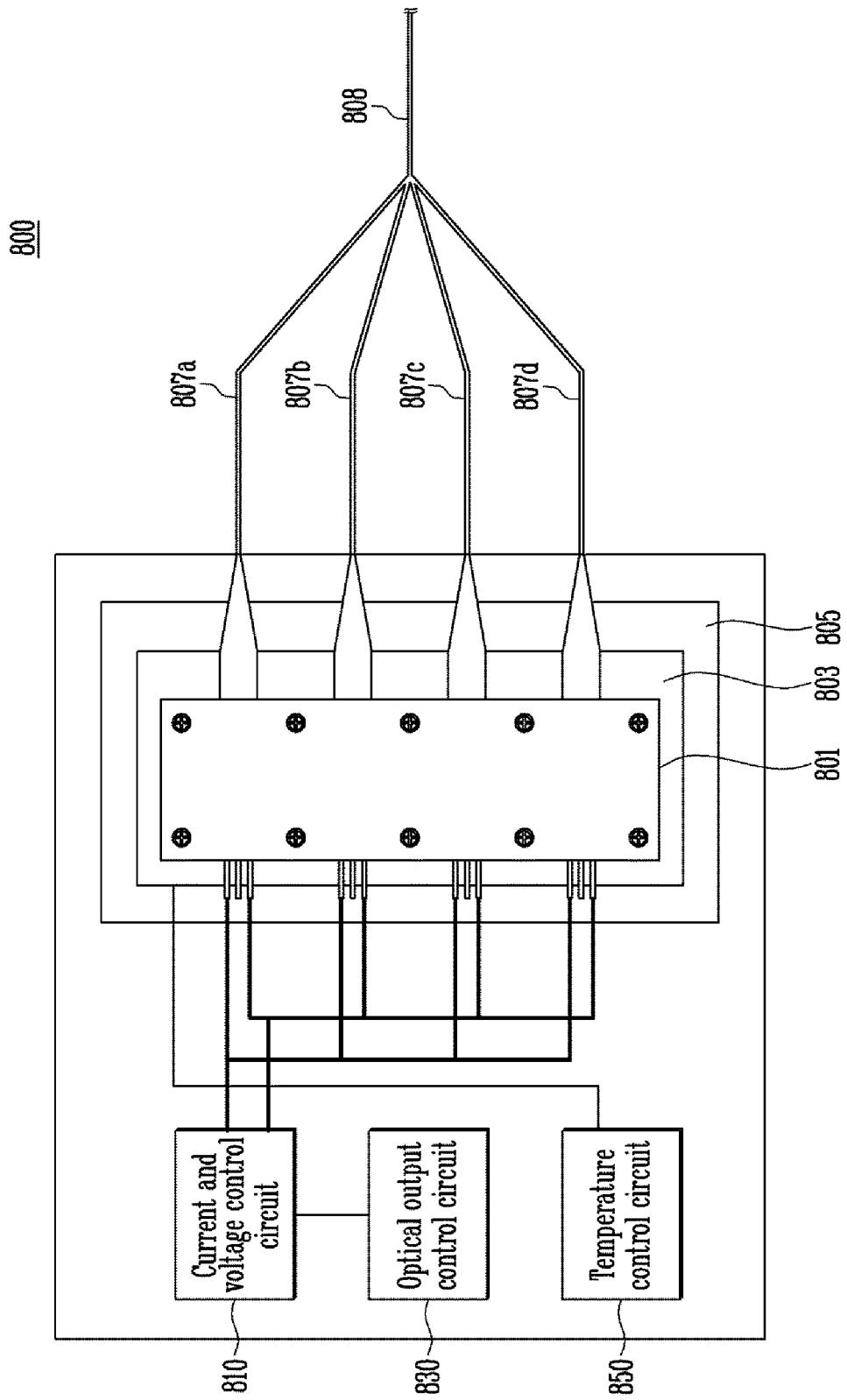
FIG. 11 is a diagram illustrating a laser module including control circuits according to an exemplary embodiment of the present invention.

FIG. 11 is a diagram illustrating a laser module including control circuits according to an exemplary embodiment of the present invention.

Referring to FIG. 11, the laser module 800 according to the exemplary embodiment of the present invention includes a plurality of high-power TOSAs, a TEC 803, a heat radiating plate, a current and voltage control circuit 810, an optical output control circuit 830, and a temperature control circuit 850. FIG. 11 illustrates that the laser module includes the four high-power TOSAs, and the four high-power TOSAs are accommodated inside an array type heat sink 801. Further, the laser module 800 includes a combined optical fiber 808 in which first to fourth optical fibers 807a, 807b, 807c, and 807d transmitting light emitted by the four or more high-power TOSAs are combined.

The optical output control circuit 830 generates an optical output control signal controlling optical output of the laser module 800. The optical output control circuit 830 may be operated based on a control signal from the outside (not shown). Further, the optical output control circuit 830 receives a feedback for a change in an optical output and the like, as an input, and reflects the received input to generation of the optical output control signal. The current and voltage control circuit 810 may output a current and a voltage based on the optical output control signal generated by the optical output control circuit 830. The current and voltage by controlling the current and voltage control circuit 810 are applied to a TO-CAN optical module within the high-power TOSAs. The temperature control circuit 850 is connected with the TEC 803 to control a temperature of the laser module. In the exemplary embodiment, the temperature control circuit 850 may include a temperature sensor.

Figure 12:
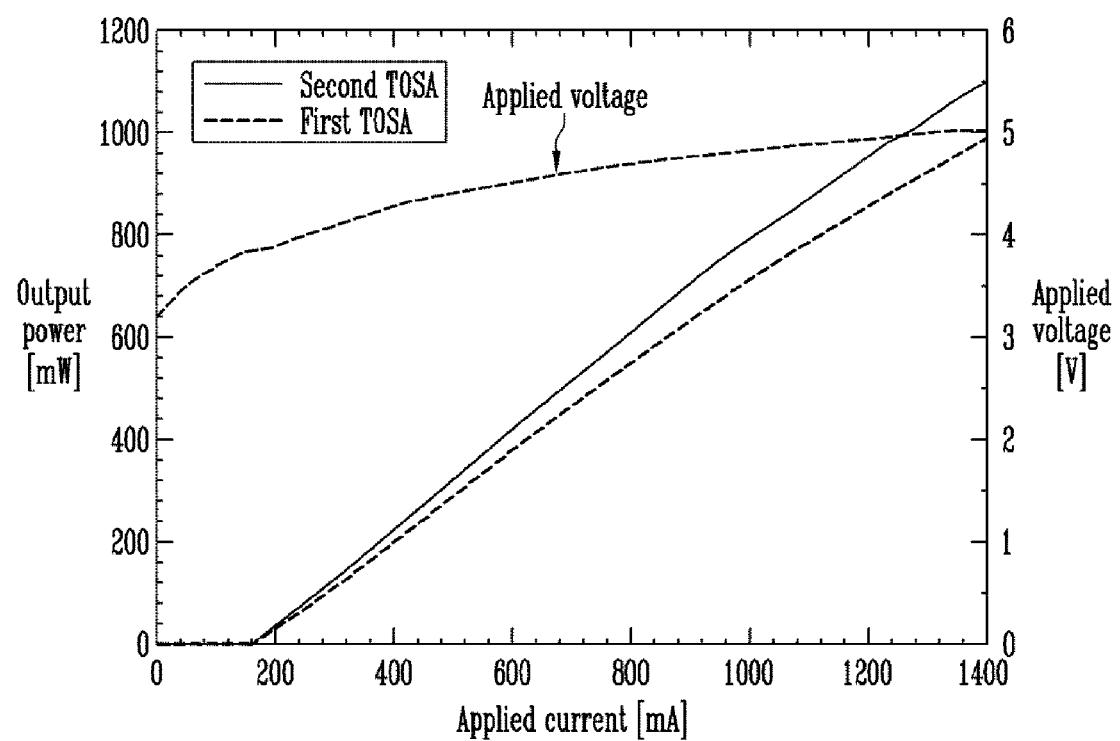
FIG. 12 is a diagram illustrating an optical output characteristic of a laser module including a heat radiating means according to an exemplary embodiment of the present invention.

FIG. 12 is a diagram illustrating an optical output characteristic of a laser module including a heat radiating means according to an exemplary embodiment of the present invention.

Referring to FIG. 12, applied currents and output power of a first high-power TOSA (a first TOSA), and a second high-power TOSA (a second TOSA) are illustrated. In FIG. 12, the applied voltage is changed from 3 V to 5 V. As illustrated in FIG. 12, it can be seen that when a current to 1,400 mA is applied, the output power of the first TOSA is linearly increased to 1 W, and the output power of the second TOSA is linearly increased to 1.1 W. As described above, the laser module according to the exemplary embodiment of the present invention includes a heat radiating means including a heat sink, so that the laser module may stably laser an optical output to 1 W or more in a case of a single high-power TOSA, thereby improving an existing deterioration characteristic.

The exemplary embodiments of the present invention disclosed in the present specification and drawings suggest the specific examples for plainly explaining the contents of the technology of the present invention and helping the understanding of the present invention, and do not limit the scope of the present invention. It is obvious to those having ordinary skill in the technical field to which the present invention pertains that in addition to the exemplary embodiments disclosed herein, various modifications may be implemented based on the technical spirit of the present invention.

What is claimed is:

1. A laser module, comprising:
   a Transmitter Optical Sub-assembly (TOSA) including an optical fiber and configured to generate light by an electrical signal and transmit the generated light through the optical fiber, the TOSA including
      an external housing,
      at least one lead line for receiving the electrical signal, and
      a fixed cover that the optical fiber is disposed within; and
   a heat radiating means which is in contact with the TOSA to decrease heat generated by the TOSA, the heat radiating means forming an enclosure that the external housing, the at least one lead line, the fixed cover and the optical fiber are disposed within so that each of the external housing, the at least one lead line, the fixed cover and the optical fiber is within the heat radiating means.

2. The laser module of claim 1, wherein the TOSA includes:
   a Transistor Outline can (TO-CAN) optical module configured to emit the light by the electrical signal, and
   wherein the optical fiber is configured to transmit the light emitted by the TO-CAN optical module,
   further wherein the external housing is configured to accommodate the TO-CAN optical module and one end of the optical fiber.

3. The laser module of claim 2, wherein the TO-CAN optical module includes:

the at least one lead line, which is an electrode configured to receive the electrical signal;
   a laser diode configured to receive the electrical signal from the electrode and generate the light based on the electrical signal input from the electrode;
   a sub mount configured to fix the laser diode;
   a fixing block configured to fix the sub mount;
   a platform configured to accommodate the fixing block and the electrode;
   a TO-CAN cylindrical block configured to cover the laser diode, the sub mount, and the fixing block on one surface of the platform; and
   an integrated lens positioned on an upper surface of the TO-CAN cylindrical block to allow light generated by the laser diode to pass through.

4. The laser module of claim 1, wherein the heat radiating means includes a heat sink formed to surround at least a part of the TOSA.

5. The laser module of claim 4, wherein the heat sink includes:
   a first heat sink block configured to cover one surface of the TOSA;
   a second heat sink block configured to cover another surface of the TOSA; and
   at least one fixing screw engaged with the first heat sink block and the second heat sink block to make the first heat sink block and the second heat sink block be in close contact with each other.

6. The laser module of claim 4, wherein the heat radiating means further includes at least one of a Thermal Electric Cooler (TEC), a chiller, and a heat radiating plate, which are attached to the heat sink to decrease the heat generated by the TOSA.

7. The laser module of claim 3, wherein the laser diode is a blue Laser Diode (Blue LD).

8. The laser module of claim 3, wherein the laser diode is a Laser Diode (LD) operated with a high power of 100 mW.

9. A laser module, comprising:
   a plurality of TOSAs including an optical fiber and configured to generate light by an electrical signal and transmit the generated light into the optical fiber, the TOSAs including
      an external housing
      at least one lead line for receiving the electrical signal, and
      a fixed cover that the optical fiber is disposed within; and
   a heat radiating means which is in contact with the plurality of TOSAs to discharge heat generated by the plurality of TOSAs, the heat radiating means forming an enclosure that the external housing, the at least one lead line, the fixed cover and the optical fiber are disposed within so that each of the external housing, the at least one lead line, the fixed cover and the optical fiber is within the heat radiating means.

10. The laser module of claim 9, wherein the optical fiber includes optical fibers, and each of the plurality of TOSAs includes:
   a TO-CAN optical module configured to generate light by the electrical signal; and
   one of the optical fibers which is configured to transmit the light generated by the TO-CAN optical module,
   wherein the external housing is configured to accommodate the TO-CAN optical module and one end of the optical fiber, and
   wherein the laser module further includes a combined optical fiber having one optical fiber, and in the combined optical fiber, the optical fibers included in the plurality of TOSAs are connected and combined into the one optical fiber.

11. The laser module of claim 9, wherein the heat radiating means includes a plurality of heat sinks formed to accommodate at least a part of the plurality of TOSAs.

12. The laser module of claim 11, wherein each of the plurality of heat sinks includes:
a first heat sink block configured to cover one surface of a corresponding TOSA of the plurality of TOSAs;
a second heat sink block configured to cover another surface of the corresponding TOSA; and
at least one fixing screw engaged with the first heat sink block and the second heat sink block to make the first heat sink block and the second heat sink block be in close contact with each other.

13. The laser module of claim 9, wherein the plurality of TOSAs is disposed in an array type, and the heat radiating means includes a heat sink formed to accommodate at least a part of the plurality of TOSAs disposed in the array type.

14. The laser module of claim 13, wherein the heat sink includes:
a first heat sink block configured to cover one surface of each of the plurality of TOSAs disposed in the array type;
a second heat sink block configured to cover another surface of each of the plurality of TOSAs disposed in the array type; and
at least one fixing screw making the first heat sink block be in close contact with the second heat sink block.

15. The laser module of claim 11, wherein the heat radiating means further includes at least one of a TEC, a chiller, and a heat radiating plate, which are attached to the heat sinks to discharge heat generated by the TOSAs.

16. The laser module of claim 10, wherein the TO-CAN optical modules include a blue Laser Diode (Blue LD).

17. The laser module of claim 10, wherein the TO-CAN optical modules include a Laser Diode (LD) operated with high power of 100 mW.

18. A laser module, comprising:
an optical output control circuit configured to output an optical output control signal;
a current and voltage control circuit configured to output a current and a voltage based on the optical output control signal output from the optical output control circuit;
a plurality of TOSAs configured to emit light based on the current and the voltage output by the current and voltage control circuit, and transmit the emitted light into an optical fiber;
a temperature control circuit configured to detect temperatures of the plurality of TOSAs and output a temperature control signal; and
a heat radiating means configured to decrease heat generated by the plurality of TOSAs based on the temperature control signal, the heat radiating means being in contact with the plurality of TOSAs.

19. The laser module of claim 18, wherein the plurality of TOSAs is disposed in an array type, the heat radiating means includes a heat sink formed to accommodate at least a part of the plurality of TOSAs disposed in the array type, and the heat radiating means further includes at least one of a TEC, a chiller, and a heat radiating plate, which are attached to the heat sink to decrease the heat generated by the TOSAs based on the temperature control signal.

20. The laser module of claim 1, wherein the heat radiating means is separate from the TOSA.

\* \* \* \* \*